United States Patent
Ma et al.

(10) Patent No.: US 10,756,136 B1
(45) Date of Patent: Aug. 25, 2020

(54) DISPLAY PANEL AND DISPLAY DEVICE

(71) Applicant: Wuhan Tianma Micro-Electronics Co., Ltd., Wuhan (CN)

(72) Inventors: Yangzhao Ma, Wuhan (CN); Xingxing Yang, Wuhan (CN); Dongliang Dun, Wuhan (CN)

( * ) Notice: Subject to any disclaimer, the term of this patent is extended or adjusted under 35 U.S.C. 154(b) by 0 days.

(21) Appl. No.: 16/591,734

(22) Filed: Oct. 3, 2019

(30) Foreign Application Priority Data

Apr. 30, 2019 (CN) .......................... 2019 1 0365397

(51) Int. Cl.
*H01L 27/15* (2006.01)
*H01L 31/147* (2006.01)
*H01L 27/32* (2006.01)

(52) U.S. Cl.
CPC ........ *H01L 27/156* (2013.01); *H01L 27/3227* (2013.01); *H01L 31/147* (2013.01)

(58) Field of Classification Search
CPC ..................................................... H01L 27/156
USPC ............................................................ 257/40
See application file for complete search history.

(56) References Cited

U.S. PATENT DOCUMENTS

| 2018/0203279 | A1* | 7/2018 | Zhou | G02F 1/133512 |
| 2019/0041709 | A1* | 2/2019 | Jiang | G02F 1/136209 |
| 2019/0325190 | A1* | 10/2019 | Cui | H01L 27/3211 |

* cited by examiner

*Primary Examiner* — Ajay Arora
(74) *Attorney, Agent, or Firm* — Kilpatrick Townsend & Stockton, LLP

(57) ABSTRACT

Provided are a display panel and display device. The display panel includes a first display area and a second display area adjacent to the first display area. The second display area is reused as a sensor reservation area. The second display area includes a plurality of light-transmissive areas and a plurality of pixel unit setting areas. A first trace area is disposed between two adjacent pixel unit setting areas in a first direction, a second trace area is disposed between two adjacent pixel unit setting areas in a second direction, and the first direction intersects with the second direction. The display panel further includes a base substrate and a light-blocking layer. The light-blocking layer is electrically connected to a preset voltage terminal.

20 Claims, 10 Drawing Sheets

DISPLAY PANEL AND DISPLAY DEVICE

CROSS-REFERENCES TO RELATED APPLICATIONS

This application claims priority to Chinese patent application No. 201910365397.7 filed on Apr. 30, 2019, disclosure of which is incorporated herein by reference in its entirety.

FIELD

The present disclosure relates to a display technology and, in particular, to a display panel and a display device.

BACKGROUND

With the development of consumer electronic products, such as mobile phones including display panels and cameras, the requirements of people on these products have not only been limited on their functions, but also turned to design, artistry and good visual experience. For example, a full screen with a high screen-to-body ratio is becoming more and more popular. The so-called screen-to-body ratio is the ratio of the screen area to the entire machine area, and a higher screen-to-body ratio can bring a better visual experience to the user.

Using the mobile phone as an example, since components such as a camera, a light sensor and the like need to be placed on the front of the mobile phone, an existing solution is generally to design a non-display area at the top of the screen, such as the "notch screen", "waterdrop screen" and other widely adopted solutions, but it is difficult to achieve the real full-screen display effect.

SUMMARY

Embodiments of the present disclosure provide a display panel and a display device to achieve the normal display of the sensor setting area under the screen, and improve the screen-to-body ratio of the display panel.

In one embodiment of the present disclosure provides a display panel. The display panel includes a first display area and a second display area adjacent to the first display area. The second display area is reused as a sensor reservation area. The second display area includes a plurality of light-transmissive areas and a plurality of pixel unit setting areas.

A first trace area is disposed between two adjacent pixel unit setting areas in a first direction. A second trace area is disposed between two adjacent pixel unit setting areas in a second direction. The first direction intersects with the second direction.

The display panel further includes: a base substrate, and a light-blocking layer.

The light-blocking layer is electrically connected to a preset voltage terminal. An orthographic projection of the light-blocking layer on the base substrate completely covers orthographic projections of a gap between two adjacent first traces in the first trace area and a gap between two adjacent second traces in the second trace area on the base substrate.

In another embodiment of the present disclosure provides a display device. The display device includes the display panel in any one of the embodiments of the present disclosure.

The display device further includes a sensor module. The sensor module is disposed in a second display area of the display panel and located on one side of the base substrate facing away from a pixel. A photosurface of the sensor module faces towards the display panel.

The display panel provided in the embodiments of the present disclosure includes a first display area and a second display area adjacent to the first display area. The second display area is reused as a sensor reservation area. The second display area includes a plurality of light-transmissive areas and a plurality of pixel unit setting areas. A first trace area is disposed between two adjacent pixel unit setting areas in a first direction. A second trace area is disposed between two adjacent pixel unit setting areas in a second direction. The first direction intersects with the second direction. The display panel further includes a base substrate and a light-blocking layer. The light-blocking layer is electrically connected to a preset voltage terminal. An orthographic projection of the light-blocking layer on the base substrate completely covers orthographic projections of a gap between two adjacent first traces in the first trace area and a gap between two adjacent second traces in the second trace area on the base substrate. By configuring a plurality of light-transmissive areas in the second display area, external light rays may be transmitted to the display panel by the light-transmissive area and received by a sensor (e.g., a camera). By configuring a plurality of pixel unit setting areas in the second display area, the normal display of the second display area may be achieved, thereby improving the screen-to-body ratio of the display panel and achieving the full-screen display. Since a plurality of traces need to be disposed between two pixel unit setting areas and a gap existing between the two adjacent traces causes easily the diffraction of external light rays, which affects the imaging effect of the camera, the diffraction of light rays between the trace gaps may be effectively blocked by configuring a light-blocking layer to block the gap between the two adjacent first traces in the first trace area and the gap between the two adjacent second traces in the second trace area, thereby improving the imaging quality.

DETAILED DESCRIPTION

Figure 1:
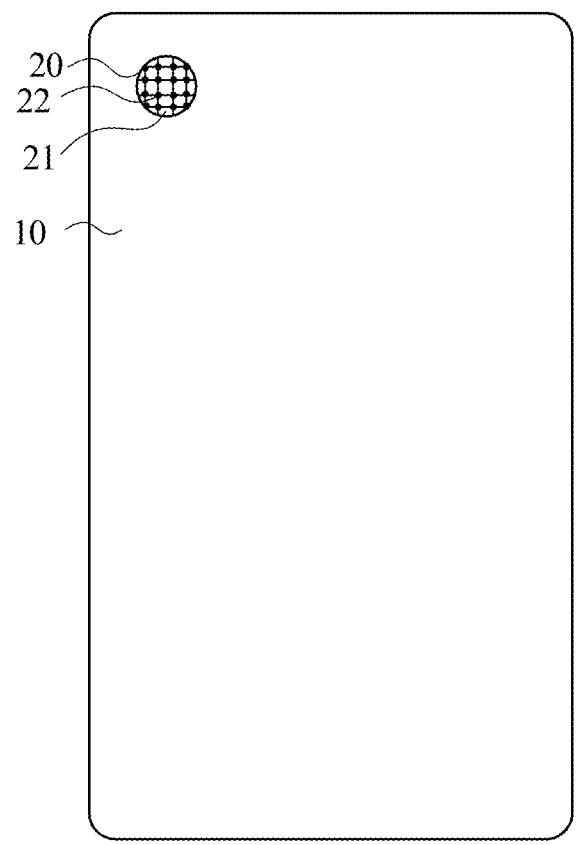
FIG. 1 is a structural view of a display panel according to an embodiment of the present disclosure.

Hereinafter the present disclosure will be further described in detail in conjunction with the drawings and embodiments. It is to be understood that the specific embodiments set forth below are intended to illustrate and not to limit the present disclosure. Additionally, it is to be noted that, for convenience of description, only part, not all, of the structures related to the present disclosure are illustrated in the drawings.

Terms used in the embodiments of the present disclosure are only used to describe specific embodiments and not intended to limit the present disclosure. It is to be noted that spatially related terms, including "on", "below", "left" and "right" used in the embodiments of the present disclosure, are described from the perspective of the drawings, and are not to be construed to limit the present disclosure. In addition, in the context, it will be understood that when a component is formed "on" or "below" another component, it may not only be directly formed "on" or "below" another component, and may also be indirectly formed "on" or "below" another component via an intermediate component. Terms like "first" and "second" are for description only and do not denote any order, quantity, or importance, but rather are used to distinguish different components. In some embodiments, the preceding term can be construed depending on specific contexts.

Figure 2:
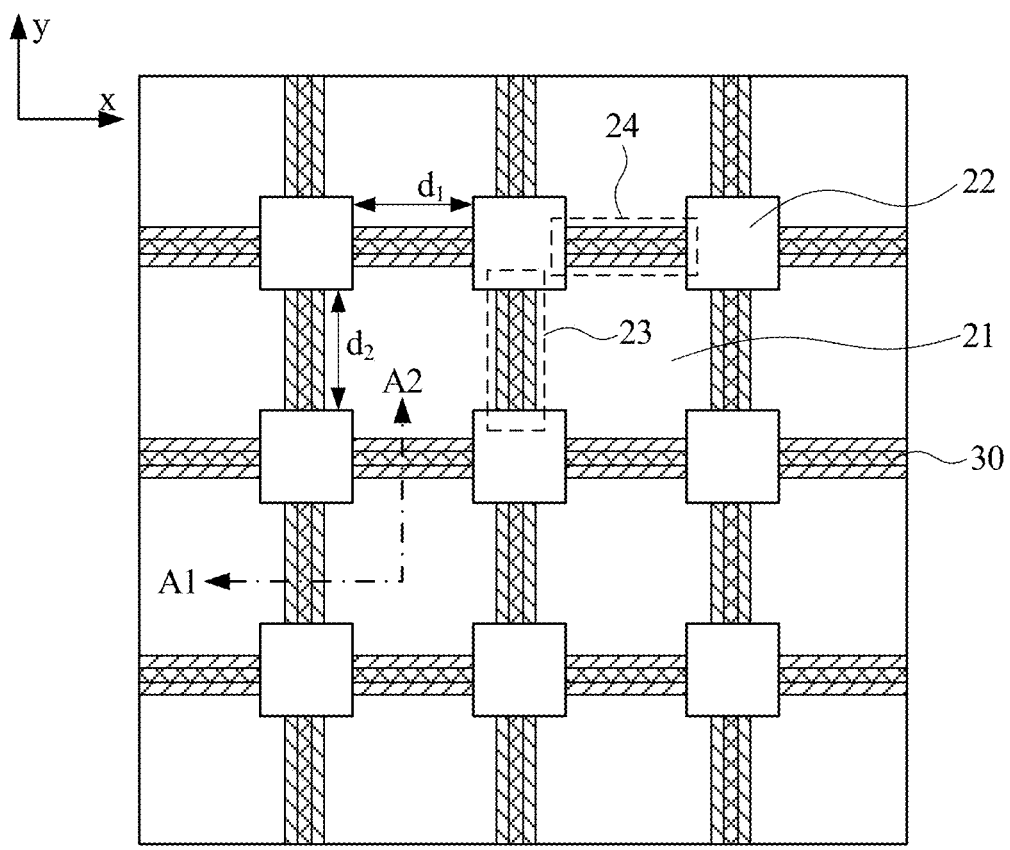
FIG. 2 is a partial structural view of a second display area of a display panel according to an embodiment of the present disclosure.
Figure 3:
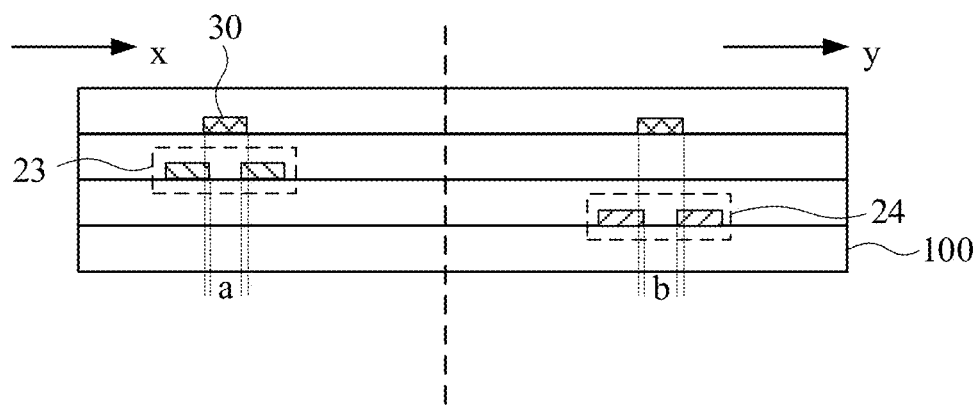
FIG. 3 is a cross sectional view taken along a line A1-A2 in FIG. 2.

FIG. 1 is a structural view of a display panel according to an embodiment of the present disclosure, FIG. 2 is a partial structural view of a second display area of a display panel according to an embodiment of the present disclosure, and FIG. 3 is a cross sectional view taken along a line A1-A2 in FIG. 2. With reference to FIGS. 1 to 3, a display panel provided in the embodiments of the present disclosure includes a first display area 10 and a second display area 20 adjacent to the first display area 10. The second display area 20 is reused as a sensor reservation area. The second display area 20 includes multiple light-transmissive areas 21 and multiple pixel unit setting areas 22. A first trace area 23 is disposed between two adjacent pixel unit setting areas 22 in a first direction y. A second trace area 24 is disposed between two adjacent pixel unit setting areas 22 in a second direction x. The first direction y intersects with the second direction x. The display panel further includes a base substrate 100 and a light-blocking layer 30. The light-blocking layer 30 is electrically connected to a preset voltage terminal (not shown in FIG. 3). Orthographic projections of a gap a between two adjacent first traces in the first trace area 23 and a gap b between two adjacent second traces in the second trace area 24 on the base substrate 100 are completely covered by an orthographic projection of the light-blocking layer 30 on the base substrate 100.

It is to be understood that the display panel provided in the embodiments of the present disclosure is suitable for a display device needing a sensor to be disposed under a screen, where the sensor may be a camera. Due to the high requirements of the camera on light rays, a hollowed area is generally disposed at an edge or inside of the display area in the related art, but the hollowed area cannot display the image, so it is difficult to achieve a real full-panel design. Since an aperture of the camera for receiving the light rays is generally set to be circular, the second display area 20 shown in FIG. 1 by way of example is a circular area. With reference to FIG. 2, the second display area 20 includes multiple light-transmissive areas 21 and multiple pixel unit setting areas 22. Each pixel unit setting area 22 may be provided with at least one pixel unit for achieving the normal display of the second display area 20. The light-transmissive area 21 is configured to transmit external light rays for the imaging of the camera. It is understood that when the camera is configured to capture images, the display function of the second display area 20 is turned off. Since the pixel unit needs to be provided with a corresponding driving circuit and a signal trace, with reference to FIG. 2, every two adjacent pixel unit setting areas 22 and traces between these pixel unit setting areas 22 form a light-transmissive area 21, and with reference to FIG. 3, the orthographic projection of the light-blocking layer 30 on the base substrate 100 is set to be completely cover orthographic projections of the gap a between two adjacent first traces in the first trace area 23 and the gap b between two adjacent second traces in the second trace area 24 on the base substrate 100, thereby effectively avoiding the diffraction of the light ray in the gap between the traces. The light-blocking layer 30 is electrically connected to a preset voltage terminal, where the preset voltage terminal may be a power voltage terminal. It is to be noted that FIG. 3 exemplarily shows that the second trace area 24 includes second traces disposed in the same layer and the first trace area 23 includes two first traces disposed in the same layer, while in other embodiments, multiple first traces in the first trace area 23 may be disposed in different layers, and multiple second traces in the second trace area 24 may be disposed in different layers, which is not limited in the embodiments of the present disclosure.

In some embodiments of the present disclosure, by configuring multiple light-transmissive areas in the second display area, external light rays may be transmitted by the light-transmissive area to the display panel and received by a sensor (e.g., a camera). By configuring multiple pixel unit setting areas in the second display area, the normal display of the second display area may be achieved, thereby improving the screen-to-body ratio of the display panel and achieving the full-screen display. Since multiple traces need to be disposed between two pixel unit setting areas and a gap existing between the two adjacent traces causes easily the diffraction of external light rays, which affects the imaging effect of the camera, by configuring a light-blocking layer to block the gap between the two adjacent first traces in the first trace area and the gap between the two adjacent second traces in the second trace area, the diffraction of light rays between the trace gaps may be effectively blocked, thereby improving the imaging quality.

In one embodiment, each pixel unit setting area includes at least one pixel unit. Each pixel unit includes multiple sub-pixels of different light-emitting colors. Each sub-pixel includes a light-emitting element including an anode, a light-emitting layer and a cathode that are sequentially stacked. The first trace is located on one side of the second trace facing towards the anode. The light-blocking layer is located between a film layer where the first trace is located and a film layer where the anode is located.

Figure 4:
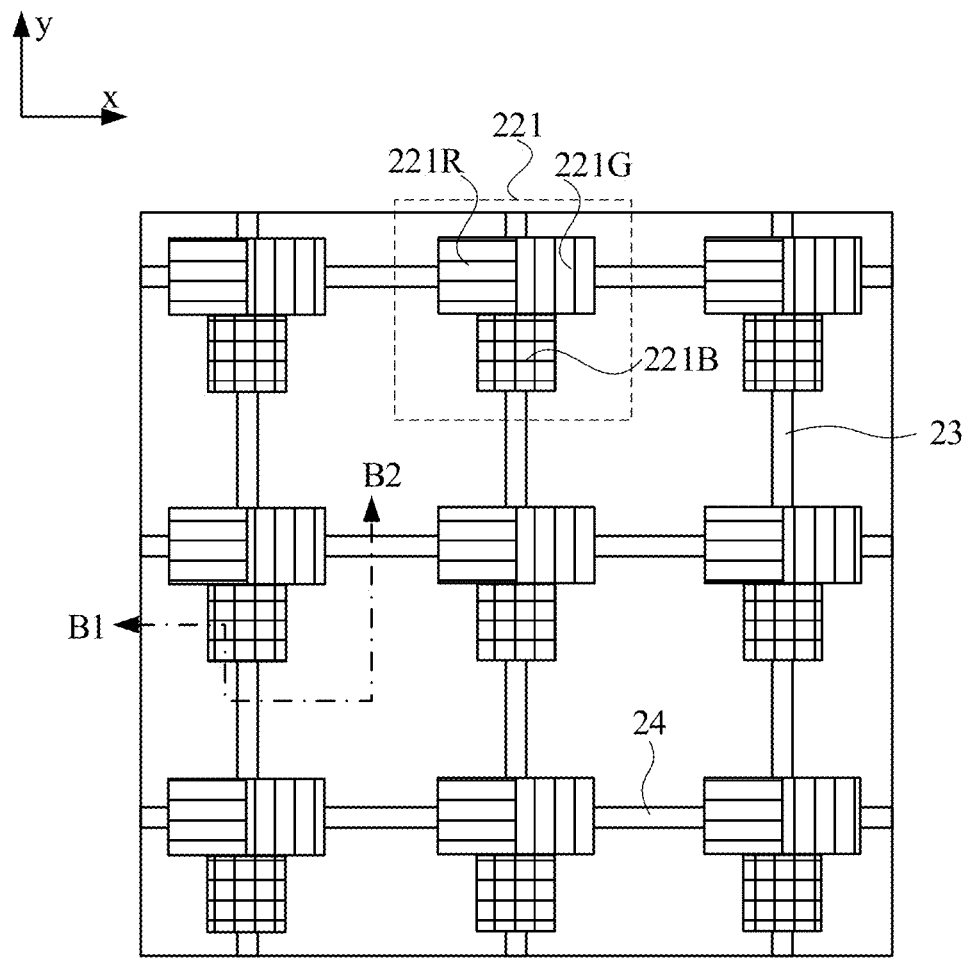
FIG. 4 is a partial structural view of a second display area of another display panel according to an embodiment of the present disclosure.
Figure 5:
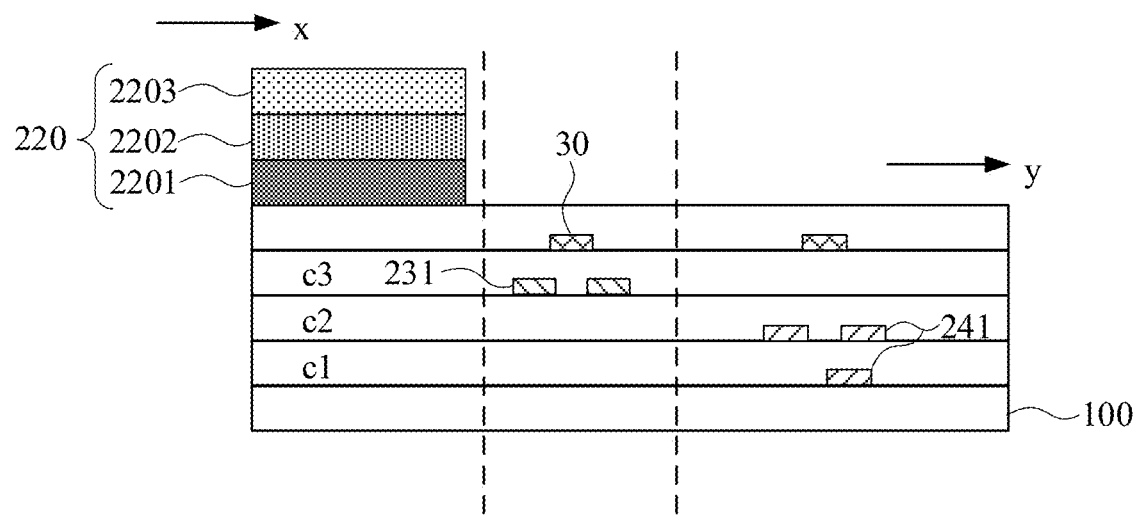
FIG. 5 is a cross sectional view taken along a line B1-B2 in FIG. 4.

Exemplarily, FIG. 4 is a partial structural view of a second display area of another display panel according to an embodiment of the present disclosure, and FIG. 5 is a cross sectional view taken along a line B1-B2 in FIG. 4. With reference to FIGS. 4 and 5, each pixel unit setting area includes a pixel unit 221, and each pixel unit includes multiple sub-pixels of different light-emitting colors, such as a red light-emitting sub-pixel 221R, a green light-emitting sub-pixel 221G and a blue light-emitting sub-pixel 221B. Each sub-pixel includes a light-emitting element 220 including an anode 2201, a light-emitting layer 2202 and a cathode 2203 that are sequentially stacked. The first trace 231 is located on one side of the second trace 241 facing towards the anode 2201. The light-blocking layer 30 is located between the film layer where the first trace 231 is located and the film layer where the anode 2201 is located.

It is to be understood that in this embodiment, taking the first direction y as a column direction and the second direction x as the row direction, the light-emitting element 220 may be an organic light-emitting diode (OLED), and the existing OLED may be driven by a driving circuit with seven transistors and a capacitor (7T1C) to emit the light. The 7T1C driving circuit includes a scan signal line, a light-emitting control signal line, a reference voltage signal line and a power voltage signal line (the second trace 241) in the row direction and a data signal line and a power voltage signal line (the first trace 231) in the column direction. In some embodiments, the scan signal line and the light-emitting control signal line are disposed in a first layer c1, the reference voltage signal line and the power voltage signal line are disposed in a second layer c2 (i.e., the second trace layer includes two layers of traces), and the data signal line and the power voltage signal line are disposed in a third layer c3. The first layer c1, the second layer c2 and the third layer c3 are sequentially disposed in a direction facing away from the base substrate. That is, the third layer c3 is closer to the anode 2201 than the first layer c1 and the second layer c2. The light-blocking layer 30 is located between a film layer where the third layer c3 is located and the film layer where the anode 2201 is located.

Figure 6:
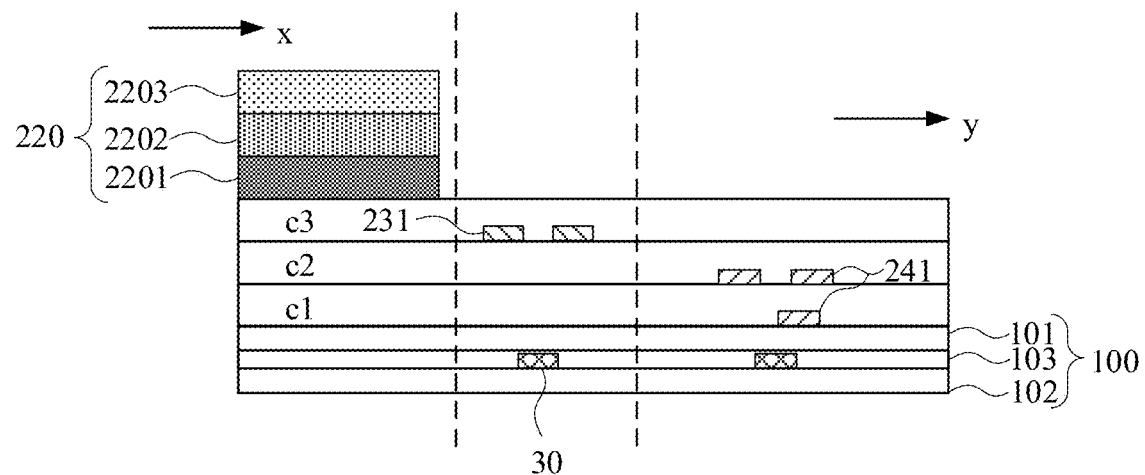
FIG. 6 is another cross sectional view taken along a line B1-B2 in FIG. 4.

FIG. 6 is another cross sectional view taken along a line B1-B2 in FIG. 4. With reference to FIG. 6, In one embodiment, the base substrate 100 includes a flexible substrate. The flexible substrate includes a first flexible substrate 101 and a second flexible substrate 102. The light-blocking layer 30 is disposed between the first flexible substrate 101 and the second flexible substrate 102.

It is to be understood that the display panel provided in the embodiments of the present disclosure may be a rigid panel or may be a flexible panel. When the display panel is a flexible panel, the base substrate 100 includes a flexible substrate. The first flexible substrate 101 and the second flexible substrate 102 may be made of the same flexible organic material, such as polyimide (PI). In this case, the light-blocking layer 30 may be disposed between the first flexible substrate 101 and the second flexible substrate 102. In a specific embodiment, a buffer layer 103 may also be disposed between the first flexible substrate 101 and the second flexible substrate 102. The buffer layer 103 may include an inorganic insulating material for preventing small molecules such as water, oxygen and the like from entering the display panel.

In one embodiment, each pixel unit setting area includes at least one pixel unit. Each pixel unit includes multiple sub-pixels of different light-emitting colors. Each sub-pixel includes a light-emitting element including an anode, a light-emitting layer and a cathode that are sequentially stacked. The light-blocking layer and the anode are disposed in the same layer.

Figure 7:
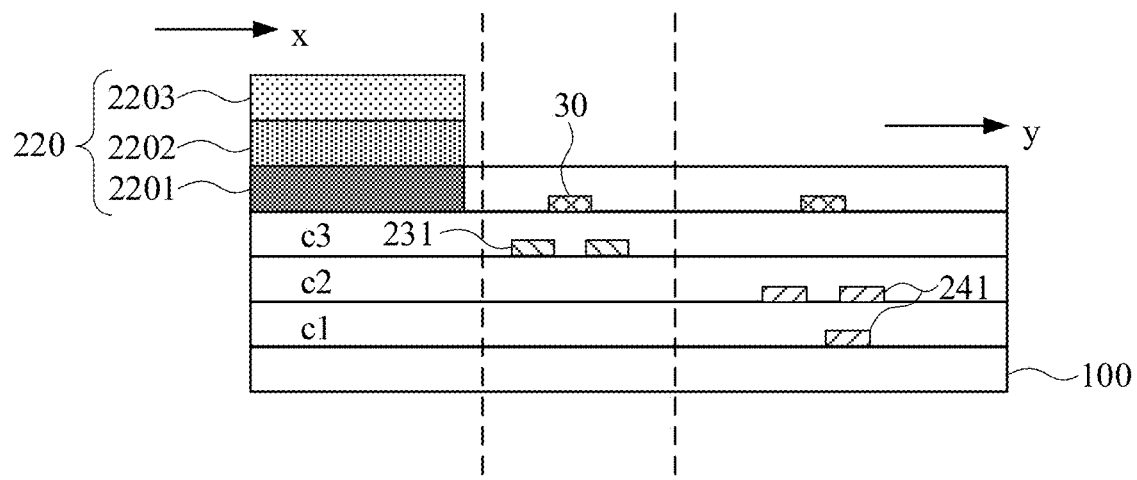
FIG. 7 is another cross sectional view taken along a line B1-B2 in FIG. 4.

FIG. 7 is another cross sectional view taken along a line B1-B2 in FIG. 4. With reference to FIG. 7, the light-blocking layer 30 and the anode 2201 are disposed in the same layer. It is to be understood that the light-emitting element in this embodiment may be a top-emitting OLED. The anode of the top-emitting OLED may be formed of indium tin oxide, silver and indium tin oxide (ITO+Ag+ITO). When the anode layer is formed, the Ag in the trace area may be retained as the light-blocking layer to block the gap between the traces in the lower film layers. By configuring the light-blocking layer and the anode in the same layer, without adding an additional process, the light-blocking layer may be formed while the anode layer is formed, thereby reducing the production cost of the display panel.

Figure 8:
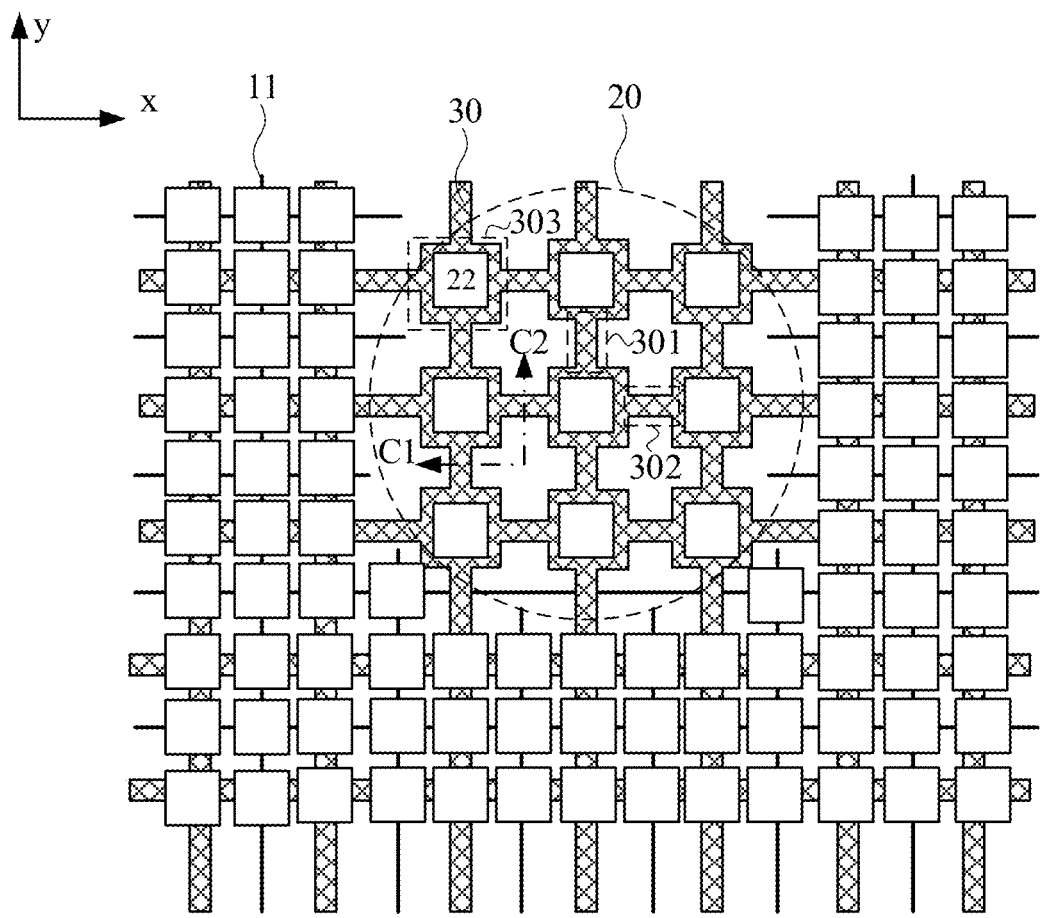
FIG. 8 is a partial structural view of a display panel according to an embodiment of the present disclosure.
Figure 9:
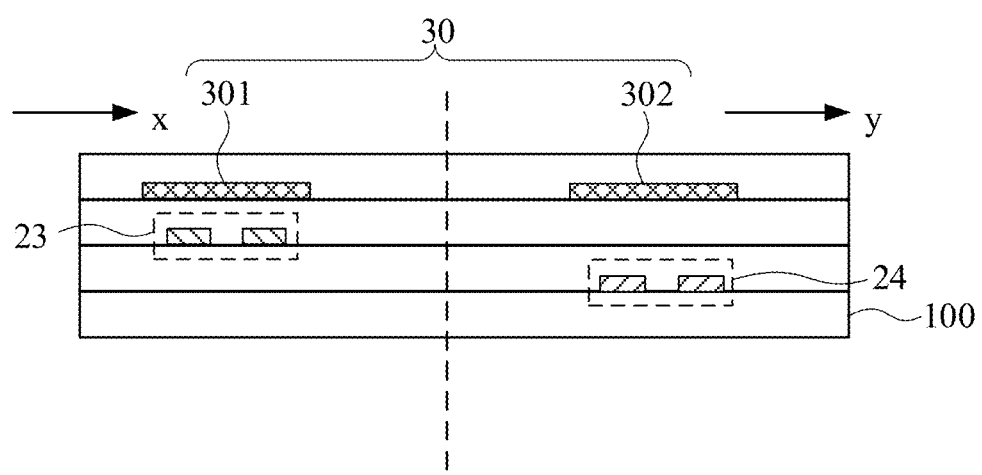
FIG. 9 is a cross sectional view taken along a line C1-C2 in FIG. 8.

FIG. 8 is a partial structural view of a display panel according to an embodiment of the present disclosure, and FIG. 9 is a cross sectional view taken along a line C1-C2 in FIG. 8. With reference to FIGS. 8 and 9, In one embodiment, the light-blocking layer 30 includes multiple first light-blocking portions 301 for covering the first trace area 23, multiple second light-blocking portions 302 for covering the second trace area 24, and a third light-blocking portion 303 for covering the multiple pixel unit setting areas 22. The first display area includes multiple first power voltage lines 11 extending in the first direction y and the second direction x. The first light-blocking portion 302 and the second light-blocking portion 302 extend to the first display area. Both the first light-blocking portion 301 and the second light-blocking portion 302 are electrically connected to the first power voltage line 11. The first light-blocking portion 301, the second light-blocking portion 302 and the third light-blocking portion 303 are connected to each other. The preset voltage terminal is a power voltage terminal.

It is to be understood that the multiple first power voltage lines 11 in the first direction y and in the second direction x may not be disposed in the same layer, or may not be disposed in the same layer as the light-blocking layer, or may be electrically connected by configuring a via hole in the non-display area (not shown in FIGS. 8 and 9), which is not limited in the embodiments of the present disclosure. Alternatively, in other embodiments, the light-blocking layer forms a mesh to cover the first display area and the second display area to form the power voltage trace of the whole display panel, thereby reducing the trace width of the second display area and increasing the area of the light-transmissive area.

It is to be noted that, since the light-blocking layer 30 needs to be disposed below the pixel unit and above the first trace area and the second trace area, for convenience of illustration of the light-blocking layer 30, the area of the light-blocking layer 30 drawn in FIG. 8 is larger than the area of the pixel unit setting area 22, the first trace area and the second trace area. In a specific embodiment, the area of the light-blocking layer 30 may be set according to actual requirements, and the light-blocking layer area may be reduced as much as possible on the premise that the light is blocked, which helps to improve the light transmittance of the second display area 20. In addition, the first light-blocking portion 301 and the second light-blocking portion 302 of the light-blocking layer may extend to the first display area, be connected in parallel with the first power voltage line 11, and be both connected to the power voltage terminal to reduce the trace resistance, thereby effectively reducing the voltage drop of the display panel caused by the trace resistance and improving the performance of the display panel.

In one embodiment, with continued to FIG. 9, orthographic projections of the first trace area 23, the second trace area 24 and the pixel unit setting area 22 on the base substrate 100 are completely covered by the orthographic projection of the light-blocking layer 30 on the base substrate 100.

It is to be understood that, since multiple traces are disposed between two pixel unit setting areas 22, multiple gaps may be formed, and multiple gaps are also between some traces of the driving circuit the pixel unit setting area. Therefore, in order to simplify the manufacture process of the light-blocking layer 30, the orthographic projection of the light-blocking layer on the base substrate 100 may be set to completely cover orthographic projections of the first trace area 23, the second trace area 24 and the pixel unit setting area 22 on the base substrate 100, so as to ensure the light-blocking effect of the light-blocking layer 30.

Figure 10:
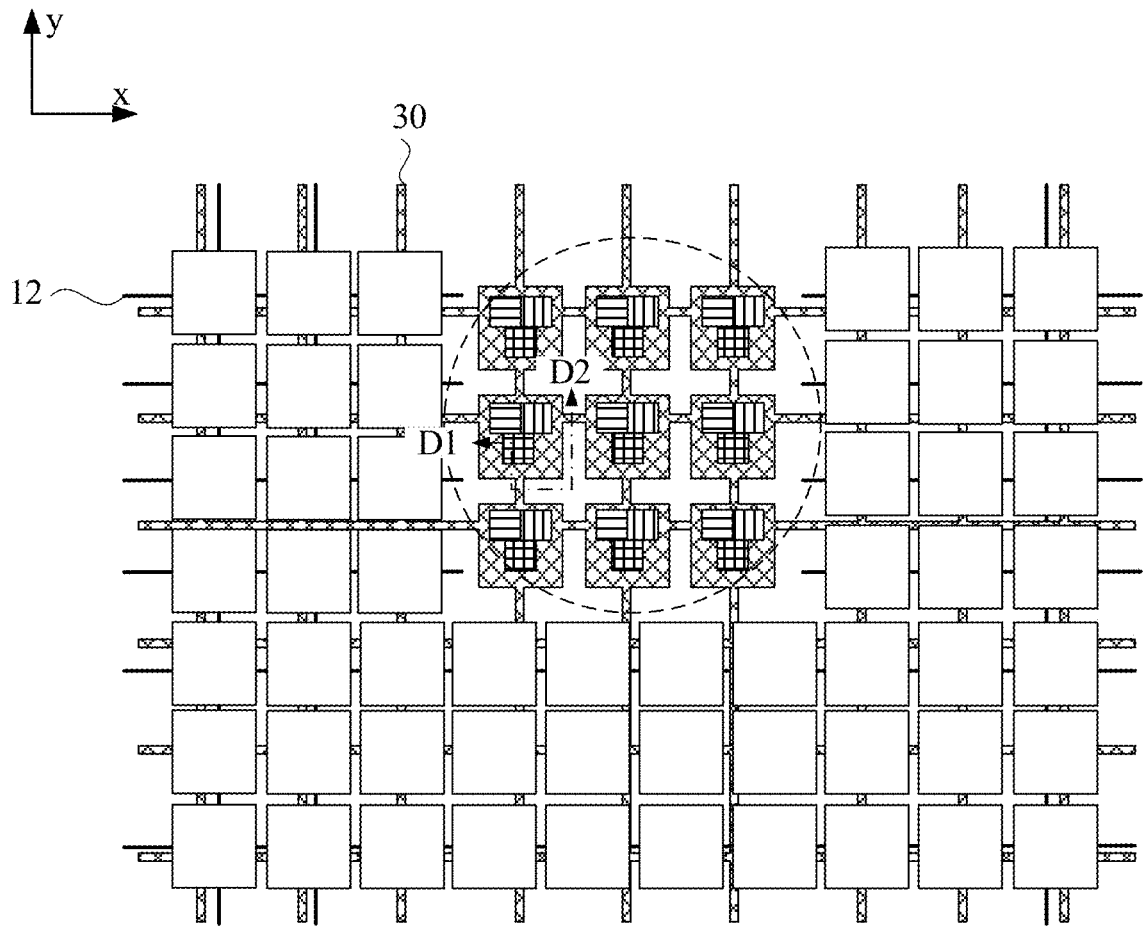
FIG. 10 is a partial structural view of another display panel according to an embodiment of the present disclosure.
Figure 11:
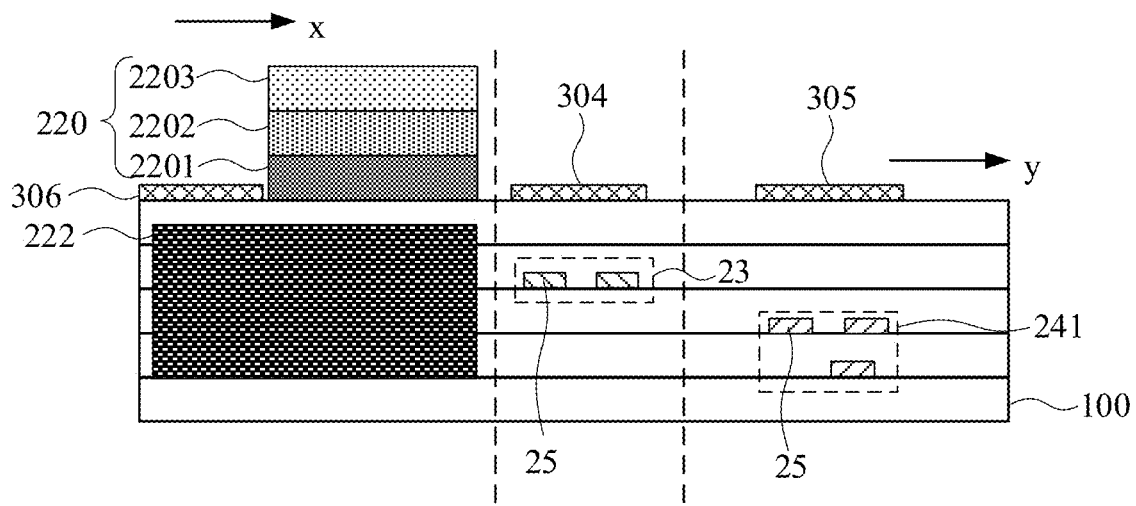
FIG. 11 is a cross sectional view taken along a line D1-D2 in FIG. 10.

FIG. 10 is a partial structural view of another display panel according to an embodiment of the present disclosure, and FIG. 11 is a cross sectional view taken along a line D1-D2 in FIG. 10. With reference to FIGS. 10 and 11, In one embodiment, the pixel unit setting area includes a driving circuit setting area 222; the light-blocking layer 30 includes a fourth light-blocking portion 304 for covering the first trace area 23, a fifth light-blocking portion 305 for covering the second trace area 24 and a sixth light-blocking portion 306 for covering the driving circuit setting area 222; the first display area includes multiple preset voltage lines 12 extending in the first direction x and the second direction y, the fourth light-blocking portion 304 and the fifth light-blocking portion 305 extend to the first display area, and both the fourth light-blocking portion 304 and the fifth light-blocking portion 305 are electrically connected to the preset voltage line 12; the fourth light-blocking portion 304, the fifth light-blocking portion 305 and the sixth light-blocking portion 306 are connected to each other; and the preset voltage terminal is a power voltage terminal or a ground terminal.

It is to be understood that the preset voltage lines 12 in the first direction y and the second direction x may not be disposed in the same layer, or may not be disposed in the same layer as the light-blocking layer, or may be electrically connected by configuring a via hole in the non-display area (not shown in FIGS. 10 and 11), which is not limited in the embodiments of the present disclosure.

It is to be noted that, since the light-blocking layer 30 needs to be disposed in the same layer as the anode layer and located above the first trace area 23 and the second trace area 24, for convenience of illustration of the light-blocking layer 30, the area of the light-blocking layer 30 drawn in FIG. 11 is the area of the first trace area 23 and the second trace area 24. In a specific embodiment, the area of the light-blocking layer 30 may be set according to actual requirements, and the light-blocking layer area may be reduced as much as possible on the premise that the light is blocked, which helps to improve the light transmittance of the second display area 20. In addition, the fourth light-blocking portion 304 and the fifth light-blocking portion 305 of the light-blocking layer extend to the first display area and are connected in parallel with the preset voltage line 12 which is electrically connected to the power voltage terminal or the ground terminal, so as to enable the light-blocking layer 30 to be kept at a constant potential and prevent a decrease in display quality due to influence on the anode. In addition, since external light rays or light emitted by the sub-pixel may irradiate into a thin film transistor (TFT) in a pixel circuit and affect the properties of the semiconductor material therein, the light rays emitting into the thin film may be directly reflected out by setting the light-blocking layer to be cover the driving circuit, so as to avoid the influence of the light rays on the TFT semiconductor.

In one embodiment, the preset voltage terminal is a power voltage terminal, and the preset voltage line is a second power voltage line. The second display area further includes multiple third power voltage lines extending in the first direction and the second direction. The third power voltage line is electrically connected to the second power voltage line.

With continued to FIG. 11, In one embodiment, the second display area further includes multiple third power voltage lines 25 extending in the first direction y and the second direction x, and the third power voltage line 25 is electrically connected to the second power voltage line.

It is to be understood that the third power voltage line 25 extending in the first direction y is disposed in the same layer as the second power voltage line extending in the first direction in the first display area and is electrically connected to the second power voltage line, and the third power voltage line 25 extending in the second direction x is disposed in the same later as the second power voltage line extending in the second direction in the first display area and is electrically connected to the second power voltage line. The first light-blocking portion 30 is also electrically connected to the power voltage terminal to form the power voltage signal line disposed in double layers, which helps to reduce the trace resistance and effectively reduce the voltage drop of the display panel due to the trace resistance, thereby improving the performance of the display panel.

In one embodiment, the orthographic projection of the light-blocking layer 30 on the base substrate 100 completely covers the orthographic projections of the first trace area 23 and the second trace area 24 on the base substrate.

It is to be understood that, since multiple traces are between two pixel unit setting areas 22, multiple gaps may be formed, and multiple gaps are also between some traces of the driving circuit setting area 222. Therefore, in order to simplify the manufacture process of the light-blocking layer 30, the orthographic projection of the light-blocking layer on the base substrate 100 may be set to completely cover orthographic projections of the first trace area 23, the second trace area 24 and the pixel unit setting area 22 on the base substrate 100, so as to ensure the light-blocking effect of the light-blocking layer 30.

Figure 12:
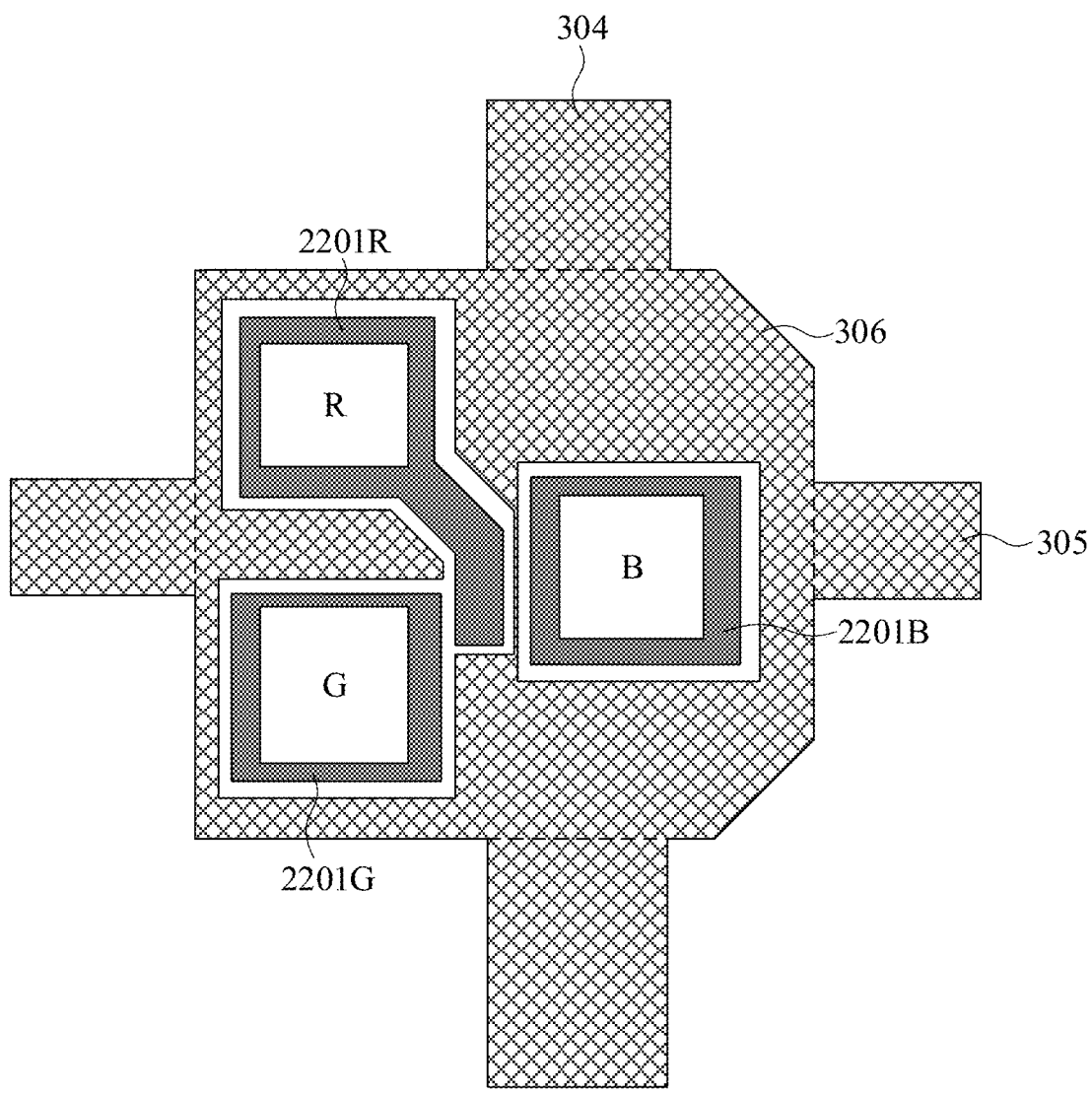
FIG. 12 is a structural view of a light-blocking layer in a pixel unit setting area in the second display area according to an embodiment of the present disclosure.

It is to be noted that, in this embodiment, since the light-blocking layer and the anode are disposed in the same layer, the light-blocking layer cannot completely cover the pixel unit setting area. FIG. 12 is a structural view of a light-blocking layer in a pixel unit setting area in the second display area according to an embodiment of the present disclosure. In FIG. 12, R, G and B respectively represent the area occupied by the light-emitting elements, 2201R, 2201G, and 2201B respectively are the anode of three light-emitting elements, the driving circuit setting area is disposed below the light-emitting elements R, G and B and occupies a larger area than the area of the three anodes, and the light-blocking layer blocks an area other than a gap between the anode and the light-blocking layer. In addition, when the trace of the driving circuit is designed, the trace may be designed to be overlapped with the gap between the anode and the light-blocking layer as much as possible, thereby eliminating the diffraction effect.

In one embodiment, the light-blocking layer includes a metal light-blocking layer.

It is to be understood that the light-blocking layer may be made of the same metal material as the trace area or an anode reflective metal layer, and the same process is used to form the trace or the anode reflective metal layer, thereby reducing the production cost.

In one embodiment, the display panel provided by the embodiments of the present disclosure further includes a cathode layer. The cathode layer includes multiple openings in the second display area. An orthographic projection of the opening on the base substrate at least partially coincides with an orthographic projection of the light-transmissive area on the base substrate.

Figure 13:
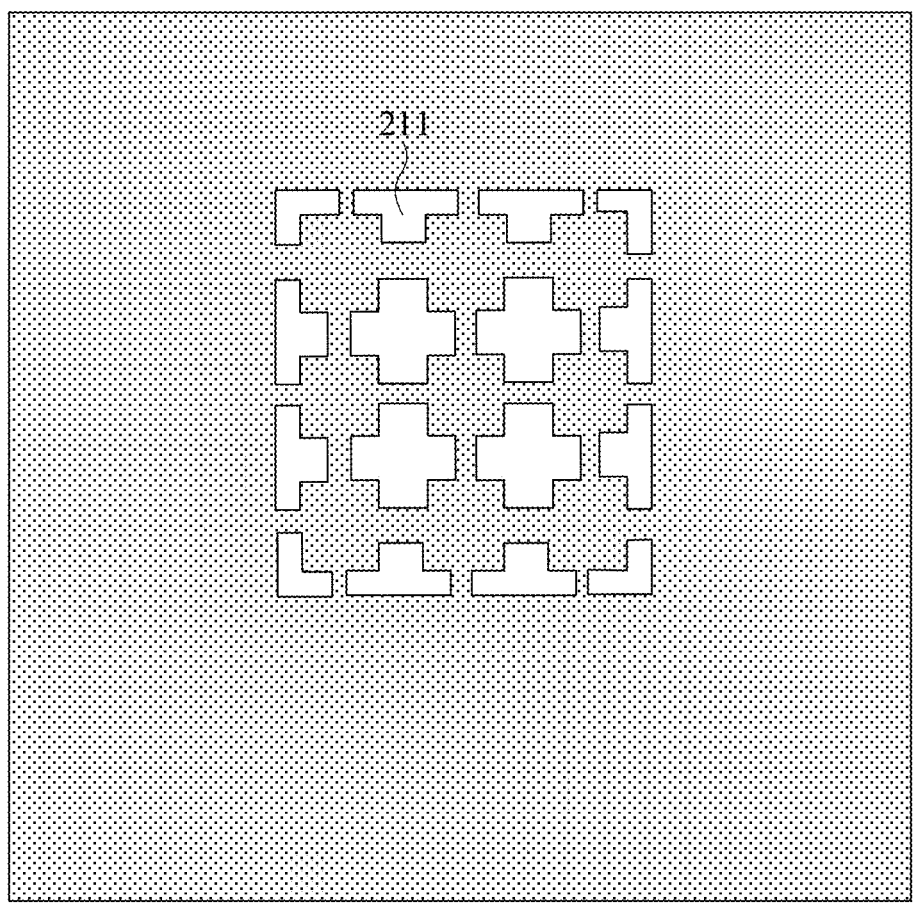
FIG. 13 is a partial structural view of a cathode layer of a display panel according to an embodiment of the present disclosure.

It is to be understood that, in the manufacture process of the existing display panel, the cathodes of all light-emitting elements is designed as a whole layer, and since the cathode layer is generally made of metal, is used for providing electrons for the light-emitting elements in the display area, and has certain light absorption property, the light-transmissive performance of the second display area may be effectively improved by providing the cathode layer with an opening in a position corresponding to the light-transmissive area of the second display area. Exemplarily, FIG. 13 is a partial structural view of a cathode layer of a display panel according to an embodiment of the present disclosure. With reference to FIG. 13, the cathode layer is provided with multiple openings 211 in a position corresponding to the light-transmissive area of the second display area, thereby increasing the transmittance of the light-transmissive area.

In one embodiment, the light-emitting element includes a Micro-LED or an organic light-emitting diode.

It is to be understood that the size of a general light emitting diode (LED) die is between 200 μm and 300 μm, and the size of the Micro-LED is much smaller than the size of the conventional LED, for example, less than 15 μm, thereby improving the transmittance of the second display area. The light-emitting element may also use the OLED which is the same as the light-emitting element used in the first display area, thereby simplifying the process.

Figure 14:
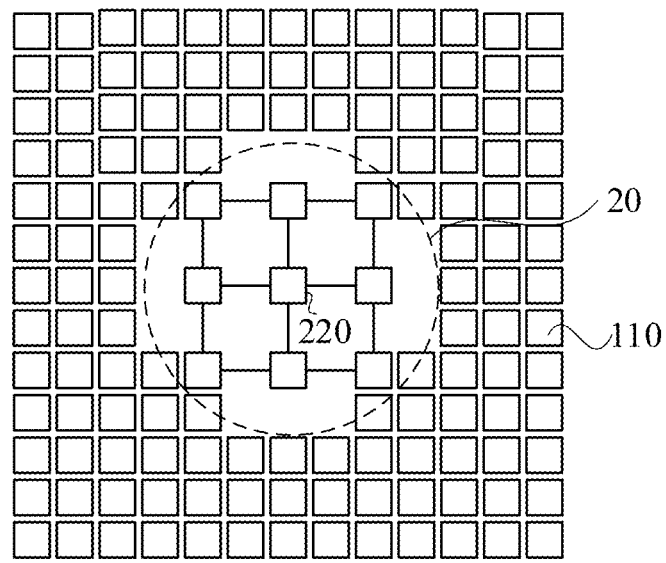
FIG. 14 is a partial structural view of yet another display panel according to an embodiment of the present disclosure.

FIG. 14 is a partial structural view of yet another display panel according to an embodiment of the present disclosure. With reference to FIG. 14, In one embodiment, the first display area includes multiple first pixel units 110 arranged in an array, and the second display area 20 includes multiple second pixel units 220 arranged in an array. A pixel unit density of the first display area is greater than a pixel unit density of the second display area 20.

It is to be understood that the light-transmissive area may transmit enough light rays by reducing the pixel unit density in the second display area 20, thereby improving the photographing effect. At the same time, in order to enable the transmittance of the second display area to reach requirements of the sensing module on the light, the overall pixel density of the second display area is substantially reduced compared to the pixel density the first display area, and by reducing the pixel unit density, sub-pixels of different colors are not far away from each other on the display panel, which may avoid a color deviation of the second display area during display, thereby ensuring the display effect.

In one embodiment, the pixel unit density of the first display area is 4 to 12 times the pixel unit density of the second display area 20.

It is to be understood that, in order to ensure the imaging effect of the camera and the display effect of the second display area 20, in this embodiment, the pixel unit density of the second display area 20 is set to be 4 to 12 times the pixel unit density of the first display area.

The pixel unit density of the second display area 20 shown in FIG. 14 is about 4 times the pixel unit density of the first display area. That is, it can be considered that three pixel units are removed every four adjacent pixel units in the first display area to achieve one pixel unit in the second display area. It is to be noted that, in other embodiments, the second display area 20 may also may achieve a certain light transmittance by being provided with other pixel unit densities or by changing the pixel unit shape or the like, which is not limited in the embodiments of the present disclosure.

In one embodiment, the first display area includes multiple first pixel units arranged in an array, and each first pixel unit includes multiple first sub-pixels of different light-emitting colors; the second display area includes multiple second pixel units arranged in an array, and each second pixel unit includes multiple second sub-pixels of different light-emitting colors; and a sub-pixel density of the first display area is greater than a sub-pixel density of the second display area.

It is to be understood that, similar to the way of reducing the pixel unit density in the second display area, since each pixel unit includes multiple subpixels of different light-emitting colors, the purpose of increasing the light-transmissive area may be achieved by removing sub-pixels in some pixel units in the second display area.

Figure 15:
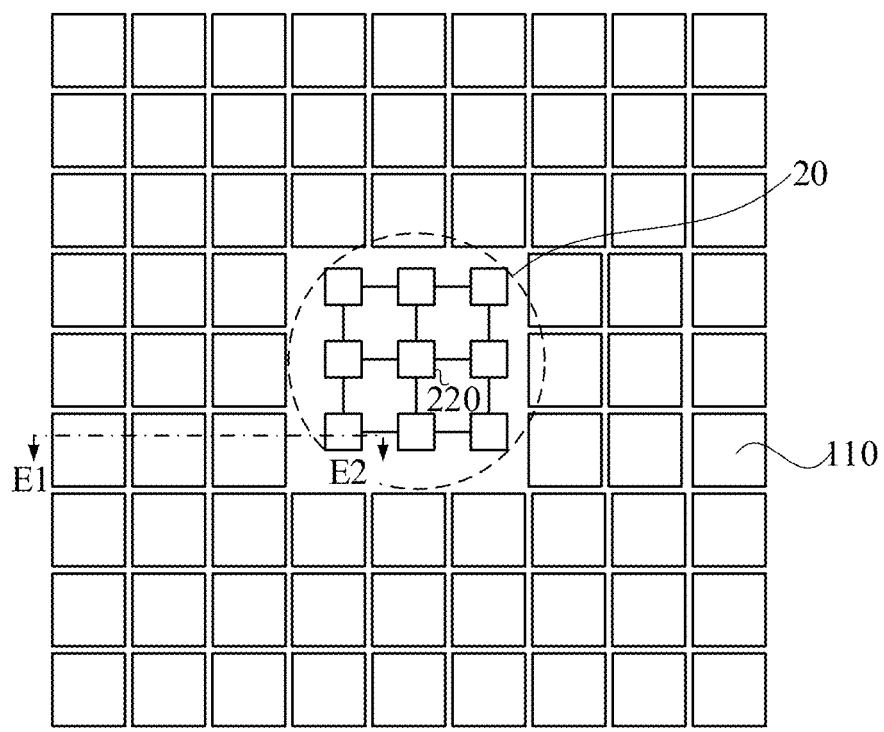
FIG. 15 is a partial structural view of yet another display panel according to an embodiment of the present disclosure.

FIG. 15 is a partial structural view of yet another display panel according to an embodiment of the present disclosure. With reference to FIG. 15, In one embodiment, the first display area includes multiple first pixel units 110 arranged in an array, the second display area 20 includes multiple second pixel units 220 arranged in an array, and a projected area of the first pixel unit 110 on the base substrate is greater than a projected area of the second pixel unit 220 on the base substrate.

It is to be understood that, in order to enable the second display area 20 to have a certain light transmittance, the projected area of the second pixel unit 220 on the base substrate may be set to be smaller than the projected area of the first pixel unit 110 on the base substrate. It is to be noted that, the projected area of each second pixel unit 220 on the base substrate in the second display area 20 shown in FIG. 15 is the same, and in other embodiments, projected areas of different second pixel units 220 on the base substrate may be set to be different. For example, the pixel units in the second display area 20 gradually decrease from the edge to the center. The pixel unit density may also be reduced by decreasing the pixel unit, so as to improve the light-transmissive performance of the second display area 20 and improve the imaging effect of the camera.

Figure 16:
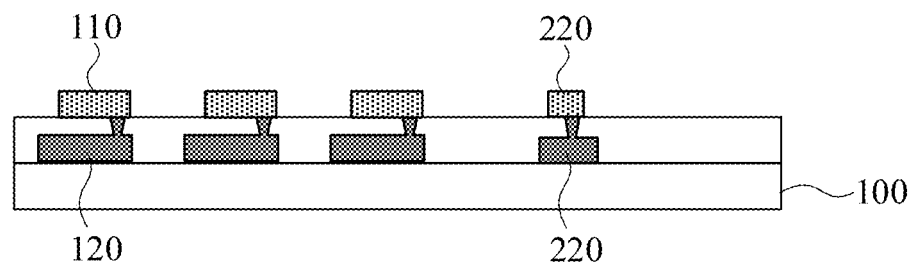
FIG. 16 is a cross sectional view taken along a line E1-E2 in FIG. 15.

FIG. 16 is a cross sectional view taken along a line E1-E2 in FIG. 15. With reference to FIG. 16, In one embodiment, the first pixel unit 110 includes a first driving circuit 120, the second pixel unit includes a second driving circuit 220, and a projected area of the first driving circuit 120 on the base substrate is greater than a projected area of the second driving circuit 220 on the base substrate.

It is to be understood that, on the basis of reducing the area of the pixel unit in the second display area, the area of the driving circuit corresponding thereto may be simultaneously reduced, accordingly, for the 7T1C circuit, a channel area length L of the driving transistor that controls the light emission of the OLED will be decreased, and since the current is inversely proportional to L during the light emission of the OLED, the luminance of the OLED is higher when the same current is applied, thereby compensating for the low luminance in the second display area due to the reduction of the pixel unit area.

In one embodiment, with continued to FIG. 2, a distance between two adjacent pixel unit setting areas in the first direction X in the second display area 20 is $d_1$, a distance between two adjacent pixel unit setting areas in the second direction y is $d_2$, and $d_1$ is equal to $d_2$. It is to be understood that by setting $d_1$ to be equal to $d_2$, the pixel units in the second display area may be arranged uniformly, so as to prevent the uneven luminance during the display of the second display area.

Figure 17:
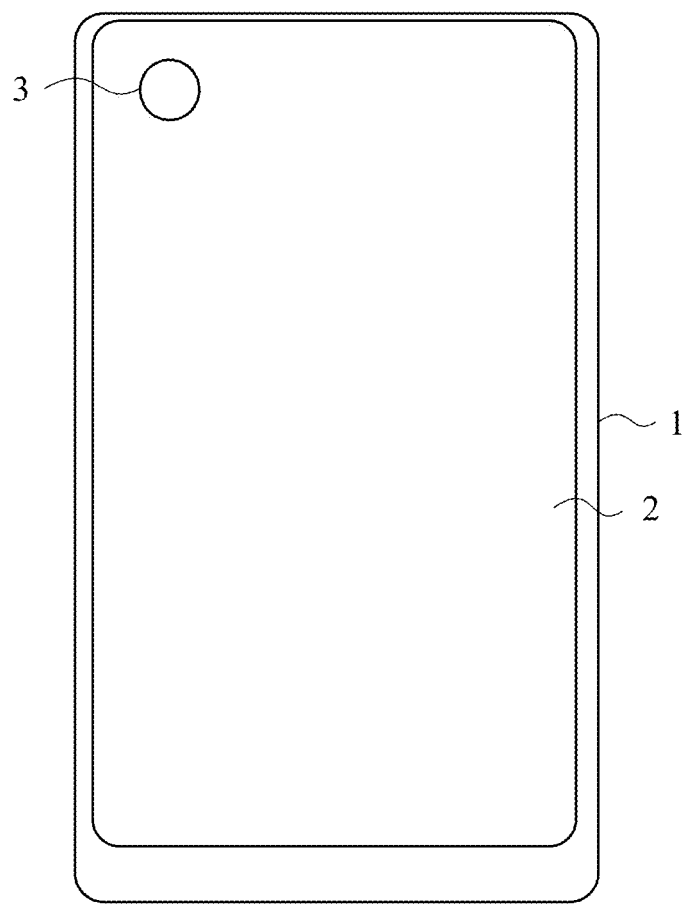
FIG. 17 is a structural view of a display device according to the embodiment of the present disclosure.

FIG. 17 is a structural view of a display device according to the embodiment of the present disclosure. With reference to FIG. 17, the display device 1 includes any one of display panels provided in the embodiments of the present disclosure, and further includes a sensor module 3. The sensor module 3 is disposed in the second display area of the display panel and located on one side of the base substrate facing away from a pixel. The photosurface of the sensor module 3 faces towards the display panel. The display device 1 may specifically be a mobile phone, a tablet computer or the like.

What is claimed is:

1. A display panel, comprising a first display area and a second display area adjacent to the first display area, wherein the second display area is reused as a sensor reservation area, and the second display area comprises a plurality of light-transmissive areas and a plurality of pixel unit setting areas; and
   a first trace area is disposed between two adjacent pixel unit setting areas in a first direction, a second trace area is disposed between two adjacent pixel unit setting areas in a second direction, and the first direction intersects with the second direction; and
   wherein the display panel further comprises:
   a base substrate, and
   a light-blocking layer, wherein the light-blocking layer is electrically connected to a preset voltage terminal, and along a direction perpendicular to a plane in which the base substrate is located, projections of a gap between two adjacent first traces in the first trace area and a gap between two adjacent second traces in the second trace area on the base substrate are completely covered by a projection of the light-blocking layer on the base substrate.

2. The display panel of claim 1, wherein each of the plurality of pixel unit setting areas comprises at least one pixel unit, and each of the at least one pixel unit comprises a plurality of sub-pixels of different light-emitting colors;
   each of the plurality of sub-pixels comprises a light-emitting element, wherein the light-emitting element comprises an anode, a light-emitting layer and a cathode that are sequentially stacked;
   a first trace is disposed on one side of the second trace facing towards the anode; and
   the light-blocking layer is disposed between a film layer where the first trace is located and a film layer where the anode is located.

3. The display panel of claim 1, wherein the base substrate comprises a flexible substrate,
   wherein the flexible substrate comprises a first flexible substrate and a second flexible substrate; and
   wherein the light-blocking layer is disposed between the first flexible substrate and the second flexible substrate.

4. The display panel of claim 2, wherein the light-blocking layer comprises a plurality of first light-blocking portions for covering the first trace area, a plurality of second light-blocking portions for covering the second trace area, and a third light-blocking portion for covering the plurality of pixel unit setting areas;
   wherein the first display area comprises a plurality of first power voltage lines extending in the first direction and the second direction, the plurality of first light-blocking portions and the plurality of second light-blocking portions extend to the first display area, both the plurality of first light-blocking portions and the plurality of second light-blocking portions are electrically connected to the plurality of first power voltage lines, and the plurality of first light-blocking portions, the plurality of second light-blocking portions and the third light-blocking portion are connected to each other; and
   wherein the preset voltage terminal is a power voltage terminal.

5. The display panel of claim 3, wherein the light-blocking layer comprises a plurality of first light-blocking portions for covering the first trace area, a plurality of second light-blocking portions for covering the second trace area, and a third light-blocking portion for covering the plurality of pixel unit setting areas;
   wherein the first display area comprises a plurality of first power voltage lines extending in the first direction and the second direction, the plurality of first light-blocking portions and the plurality of second light-blocking portions extend to the first display area, both the plurality of first light-blocking portions and the plurality of second light-blocking portions are electrically connected to the plurality of first power voltage lines, and the plurality of first light-blocking portions, the plurality of second light-blocking portions and the third light-blocking portion are connected to each other; and
   wherein the preset voltage terminal is a power voltage terminal.

6. The display panel of claim 1, wherein each of the plurality of pixel unit setting areas comprises at least one pixel unit, and each of the at least one pixel unit comprises a plurality of sub-pixels of different light-emitting colors;
   wherein each of the plurality of sub-pixels comprises a light-emitting element, wherein the light-emitting element comprises an anode, a light-emitting layer and a cathode that are sequentially stacked; and
   wherein the light-blocking layer and the anode are disposed in a same layer.

7. The display panel of claim 6, wherein each of the plurality of pixel unit setting areas comprise a driving circuit setting area;
   wherein the light-blocking layer comprises a fourth light-blocking portion for covering the first trace area, a fifth light-blocking portion for covering the second trace area and a sixth light-blocking portion for covering the driving circuit setting area;
   wherein the first display area comprises a plurality of preset voltage lines extending in the first direction and the second direction, the fourth light-blocking portion and the fifth light-blocking portion extend to the first display area, both the fourth light-blocking portion and the fifth light-blocking portion are electrically connected to the plurality of preset voltage lines, and the fourth light-blocking portion, the fifth light-blocking portion and the sixth light-blocking portion are connected to each other; and
   wherein the preset voltage terminal is a power voltage terminal or a ground terminal.

8. The display panel of claim 7, wherein the preset voltage terminal is a power voltage terminal, and the plurality of preset voltage lines are second power voltage lines; and
wherein the second display area further comprises a plurality of third power voltage lines extending in the first direction and the second direction, and the plurality of third power voltage lines are electrically connected to the second power voltage lines.

9. The display panel of claim 1, wherein along the direction perpendicular to the plane in which the base substrate is located, projections of the first trace area and the second trace area on the base substrate are completely covered by the orthographic projection of the light-blocking layer on the base substrate.

10. The display panel of claim 1, wherein along the direction perpendicular to the plane in which the base substrate is located, projections of the first trace area, the second trace area and the pixel unit setting area on the base substrate are completely covered by the orthographic projection of the light-blocking layer on the base substrate.

11. The display panel of claim 1, wherein the light-blocking layer comprises a metal light-blocking layer.

12. The display panel of claim 1, further comprising a cathode layer, wherein the cathode layer comprises a plurality of openings in the second display area, and orthographic projections of the plurality of openings on the base substrate at least partially coincide with orthographic projections of the plurality of light-transmissive areas on the base substrate.

13. The display panel of claim 1, wherein each of the plurality of pixel unit setting areas comprises at least one pixel unit, and each of the at least one pixel unit comprises a plurality of sub-pixels of different light-emitting colors;
each of the plurality of sub-pixels comprises a light-emitting element, wherein the light-emitting element comprises a Micro-light-emitting diode (LED) or an organic light-emitting diode.

14. The display panel of claim 1, wherein the first display area comprises a plurality of first pixel units arranged in an array, and the second display area comprises a plurality of second pixel units arranged in an array; and
a pixel unit density of the first display area is greater than a pixel unit density of the second display area.

15. The display panel of claim 14, wherein the pixel unit density of the first display area is 4 to 12 times the pixel unit density of the second display area.

16. The display panel of claim 1, wherein the first display area comprises a plurality of first pixel units arranged in an array, and each of the plurality of first pixel units comprises a plurality of first sub-pixels of different light-emitting colors; and wherein the second display area comprises a plurality of second pixel units arranged in an array, and each of the plurality of second pixel units comprises a plurality of second sub-pixels of different light-emitting colors; and
a sub-pixel density of the first display area is greater than a sub-pixel density of the second display area.

17. The display panel of claim 1, wherein the first display area comprises a plurality of first pixel units arranged in an array, and the second display area comprises a plurality of second pixel units arranged in an array; and
an area of each of the plurality of first pixel units on the base substrate is greater than an area of each of the plurality of second pixel units on the base substrate.

18. The display panel of claim 17, wherein each of the plurality of first pixel units comprise a first driving circuit, each of the plurality of second pixel units comprise a second driving circuit, and a projected area of the first driving circuit on the base substrate is greater than a projected area of the second driving circuit on the base substrate.

19. The display panel of claim 1, wherein a distance between two adjacent pixel unit setting areas in the first direction in the second display area is $d_1$, a distance between two adjacent pixel unit setting areas in the second direction is $d_2$, and $d_1$ is equal to $d_2$.

20. A display device, comprising:
a display panel; and
a sensor module, which is disposed in a second display area of the display panel and located on one side of the base substrate facing away from a pixel, wherein a photosurface of the sensor module faces towards the display panel;
wherein the display panel comprises:
a first display area and a second display area adjacent to the first display area, wherein the second display area is reused as a sensor reservation area, and the second display area comprises a plurality of light-transmissive areas and a plurality of pixel unit setting areas; and
a first trace area is disposed between two adjacent pixel unit setting areas in a first direction, a second trace area is disposed between two adjacent pixel unit setting areas in a second direction, and the first direction intersects with the second direction; and
wherein the display panel further comprises:
a base substrate, and
a light-blocking layer, wherein the light-blocking layer is electrically connected to a preset voltage terminal, and along a direction perpendicular to a plane in which the base substrate is located, projections of a gap between two adjacent first traces in the first trace area and a gap between two adjacent second traces in the second trace area on the base substrate are completely covered by a projection of the light-blocking layer on the base substrate.

* * * * *